(12) United States Patent
Shen et al.

(10) Patent No.: US 11,572,078 B2
(45) Date of Patent: Feb. 7, 2023

(54) VEHICLE NAVIGATION GUIDANCE SYSTEM AND VEHICLE

(71) Applicant: Shanghai Huace Navigation Technology Ltd, Shanghai (CN)

(72) Inventors: Xuefeng Shen, Shanghai (CN); Qiang Ren, Shanghai (CN); Haifeng Deng, Shanghai (CN); Wei Tian, Shanghai (CN); Mangmang Xie, Shanghai (CN); Changnan Guo, Shanghai (CN); Xiaoyu Chen, Shanghai (CN); Kewu Hu, Shanghai (CN)

(73) Assignee: Shanghai Huace Navigation Technology Ltd, Shanghai (CN)

( * ) Notice: Subject to any disclaimer, the term of this patent is extended or adjusted under 35 U.S.C. 154(b) by 196 days.

(21) Appl. No.: 17/015,940

(22) Filed: Sep. 9, 2020

(65) Prior Publication Data
US 2021/0213968 A1   Jul. 15, 2021

(30) Foreign Application Priority Data

Jan. 13, 2020  (CN) .......................... 202010033392.7

(51) Int. Cl.
*G01C 21/34*   (2006.01)
*G01S 19/42*   (2010.01)
(Continued)

(52) U.S. Cl.
CPC .......... *B60W 60/001* (2020.02); *B60W 10/20* (2013.01); *B60W 10/30* (2013.01);
(Continued)

(58) Field of Classification Search
CPC .... H02K 11/215; B60W 10/20; B60W 10/30; B60W 50/06; B64C 19/00; G01C 21/3407; G01S 19/42; G01S 19/53
See application file for complete search history.

(56) References Cited

U.S. PATENT DOCUMENTS

| 6,211,817 B1* | 4/2001 | Eschenbach | G01S 19/071 |
| | | | 342/357.44 |
| 2018/0031383 A1* | 2/2018 | Chang | G01C 21/36 |

(Continued)

FOREIGN PATENT DOCUMENTS

| CN | 201961367 U | 9/2011 |
| CN | 102506852 A | 6/2012 |

(Continued)

OTHER PUBLICATIONS

Automatic U-turn Path Planning and Tracking for Work Vehicle Navigation, www.chinacaaa.com, Dec. 2015, pp. 9-12.

(Continued)

*Primary Examiner* — Peter D Nolan
*Assistant Examiner* — Mikko Okechukwu Obioha
(74) *Attorney, Agent, or Firm* — Mark H. Whittenberger; Holland & Knight LLP

(57) ABSTRACT

Disclosed are a vehicle navigation guidance system and a vehicle. The system includes: a navigation controller, a steering angle sensor, a motor steering controller and a display controller. The steering angle sensor is communicatively connected to the navigation controller, and is configured to acquire rotational angular velocity information of a wheel relative to a vehicle body, and output the angular velocity information to the navigation controller. The navigation controller is configured to output navigation guidance information according to positioning information and the angular velocity information, where the navigation controller includes a first positioning device, and the first positioning device is configured to acquire the positioning information. The motor steering controller is communicatively connected to the navigation controller, and is configured to perform steering control according to the navigation guidance information. The display controller is communicatively
(Continued)

connected to the navigation controller, and is configured to display the navigation guidance information.

18 Claims, 9 Drawing Sheets

(51) Int. Cl.

| | | |
|---|---|---|
| *G01S 19/53* | (2010.01) | |
| *G05B 15/02* | (2006.01) | |
| *B60W 60/00* | (2020.01) | |
| *H02K 11/215* | (2016.01) | |
| *B63B 79/40* | (2020.01) | |
| *B60W 10/20* | (2006.01) | |
| *B60W 10/30* | (2006.01) | |
| *B60W 50/06* | (2006.01) | |
| *B60W 50/14* | (2020.01) | |
| *B64C 19/00* | (2006.01) | |
| *H02K 5/10* | (2006.01) | |
| *H03H 17/02* | (2006.01) | |
| *H04B 1/06* | (2006.01) | |

(52) U.S. Cl.
 CPC ............ *B60W 50/06* (2013.01); *B60W 50/14* (2013.01); *B63B 79/40* (2020.01); *B64C 19/00* (2013.01); *G01C 21/3407* (2013.01); *G01S 19/42* (2013.01); *G01S 19/53* (2013.01); *G05B 15/02* (2013.01); *H02K 5/10* (2013.01); *H02K 11/215* (2016.01); *B60W 2510/20* (2013.01); *B60W 2520/00* (2013.01); *H03H 17/0202* (2013.01); *H03H 2017/0205* (2013.01); *H04B 1/06* (2013.01)

(56) References Cited

U.S. PATENT DOCUMENTS

| | | | |
|---|---|---|---|
| 2018/0373249 A1* | 12/2018 | Choi | G01C 21/3685 |
| 2019/0138016 A1* | 5/2019 | Ogihara | B60Q 1/46 |
| 2020/0262424 A1* | 8/2020 | Kong | G05D 1/0212 |
| 2021/0197805 A1* | 7/2021 | Robbel | B60Q 1/525 |
| 2021/0278511 A1* | 9/2021 | Krishnan | G01S 13/931 |

FOREIGN PATENT DOCUMENTS

| | | |
|---|---|---|
| CN | 105203129 A | 12/2015 |
| CN | 106314528 A | 1/2017 |
| CN | 106646539 A | 5/2017 |
| CN | 107738690 A | 2/2018 |
| CN | 108007417 A | 5/2018 |
| CN | 108762323 A | 11/2018 |

OTHER PUBLICATIONS

First Office Action, CN Application No. 202010033392.7, dated Mar. 12, 2021, pp. 1-12, SIPO, China. (Original Chinese Language).
First Office Action, CN Application No. 202010033392.7, dated Mar. 12, 2021, pp. 1-12, SIPO, China. (English Translation).

* cited by examiner

| | | | Gain | | |
|---|---|---|---|---|---|
| All-attitude Installation | Angle Sensor | Wheel | | Installation offset | |

| | | | | Variable | Value |
|---|---|---|---|---|---|
| Angle sensor type | GASensor | ⌄ | | Angle original value | 0 |
| Installation location | Left wheel ⌄ | Setting | | Angle value | 0.00 |
| | | | | Course deviation | 0.00 |
| Installation direction | UP ⌄ | Setting | | Horizontal deviation | 0.00M |
| | | | | Oil pressure value | 70 |
| Type | C ⌄ | Setting | | | |
| Static Judgment Value | 1.000 | Setting | | | |
| Conditional threshold | 0.200 | Setting | | | |

| Oil pressure threshold | 0 | Dead zone | 0 | Setting |
|---|---|---|---|---|

FIG. 6

| All-attitude Installation | Angle Sensor | Wheel | Gain | Installation offset | |

Calibration parameter

| Steering ratio | 18.0 | Setting |
| Steering ratio offset | 0.0 | Setting |
| Dead zone | 800 | Setting |
| Dead zone offset | 0 | Setting |

Note: Click START to calibrate when the vehicle maintains a speed of 2km/h  STOP  STRAT

| Algorithm mode | Mode2 | |
| Moment of force | 5 | Setting |
| Proportion | 20 | Setting |
| Differential | 100 | Setting |
| Angle dead zone | 2 | Setting |
| Maximum rotational speed | 20 | Setting |
| Softening factor | 100 | Setting |

FIG. 7

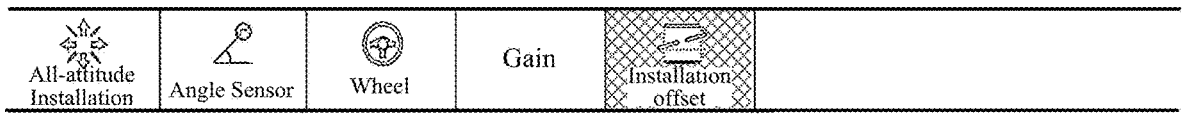
| Variable | Value |
|---|---|
| Pitch angle deviation | 0.00 |
| Roll angle deviation | 0.00 |
| Installation angle... | 0.00 |
| Median angle | 0.00 |
| Roll angle | 1.39 |
| Pitch angle | -2.37 |
| | |
Attention
1. Ensure that there is sufficient open space for the vehicle, which is at least 70m long.
2. The base of the receiver shall be kept flat.
3. The vehicle shall be kept at an even speed.
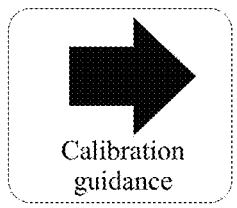
Calibration guidance
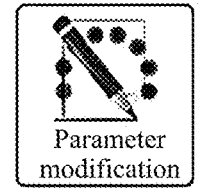
Parameter modification
FIG. 8

VEHICLE NAVIGATION GUIDANCE SYSTEM AND VEHICLE

CROSS-REFERENCE TO RELATED APPLICATIONS

This application claims priority to a Chinese patent application No 202010033392.7, filed on Jan. 13, 2020, disclosure of which is incorporated herein by reference in its entirety.

TECHNICAL FIELD

The present application relates to vehicle control technologies and in particular, to a vehicle navigation guidance system and a vehicle.

BACKGROUND

With the popularization of Global Navigation Satellite System (GNSS) navigation technology and automatic control technology, vehicle navigation control has become an important function for agricultural vehicles (such as tractors, harvesters and the like) and engineering machinery vehicles (such as rollers, cranes and the like).

The vehicle navigation guidance control generally includes two parts. The first part is to determine vehicle state information, that is, information such as a position, attitude, speed and front wheel rotation angle of a vehicle is determined in a known coordinate system. The second part is control, including navigation control, execution control and the like, so that the vehicle travels along a certain path or travels following certain rules.

However, the current vehicle navigation guidance system is not perfect enough and needs to be improved.

SUMMARY

Embodiments of the present application provide a vehicle navigation guidance system and a vehicle, which can optimize an existing scheme of a vehicle navigation guidance system.

In a first aspect, an embodiment of the present application provides a vehicle navigation guidance system. The vehicle navigation guidance system is installed in a vehicle, and includes a navigation controller, a steering angle sensor, a motor steering controller and a display controller.

The steering angle sensor is communicatively connected to the navigation controller, and is configured to acquire rotational angular velocity information of a wheel relative to a vehicle body, and output the angular velocity information to the navigation controller.

The navigation controller is configured to output navigation guidance information according to positioning information and the angular velocity information, where the navigation controller includes a first positioning device, and the first positioning device is configured to acquire the positioning information.

The motor steering controller is communicatively connected to the navigation controller, and is configured to perform steering control according to the navigation guidance information.

The display controller is communicatively connected to the navigation controller, and is configured to display the navigation guidance information.

In a second aspect, an embodiment of the present application provides a vehicle. The vehicle includes the vehicle navigation guidance system provided by the embodiments of the present application installed in the vehicle.

BRIEF DESCRIPTION OF DRAWINGS

FIG. 6 is a schematic diagram of an interface of a wheel angle sensor calibration according to an embodiment of the present application;

FIG. 7 is a schematic diagram of an interface of an electronic steering wheel automatic calibration according to an embodiment of the present application;

FIG. 8 is a schematic diagram of an interface of a system electronic equipment and sensor installation error automatic calibration according to an embodiment of the present application;

DETAILED DESCRIPTION

Figure 1:
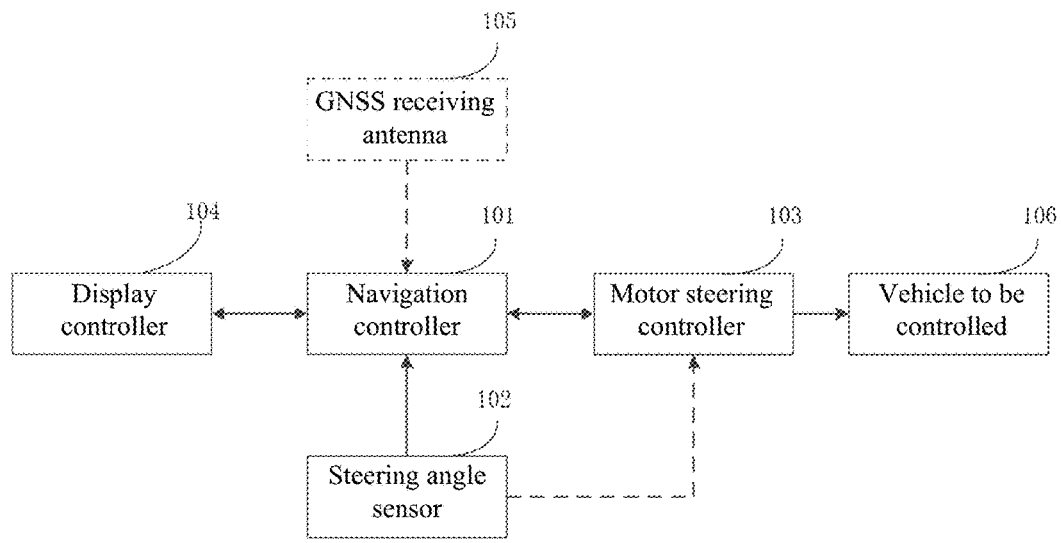
FIG. 1 is a structural diagram of a vehicle navigation guidance system according to an embodiment of the present application.

The technical solutions of the present application will be further described below through specific embodiments in conjunction with the drawings. It is to be understood that the specific embodiments set forth below are intended to illustrate and not to limit the present application. Additionally, it is to be noted that, for ease of description, only part, not all, of the structures related to the present application are illustrated in the drawings.

With the popularization of high precision satellite navigation technology and the automatic control technology of Global Navigation Satellite System (GNSS), precision agriculture has become the main development direction of agricultural modernization. A GNSS-based agricultural navigation system has become a hotspot of research. This kind of navigation system mainly acquires absolute position information of the vehicle through a GNSS sensor and compares the absolute position information with preset path information, to determine a relative position relationship between the vehicle and the path, thus implementing the navigation guidance and control of the vehicle. The vehicle navigation guidance control includes two parts. The first part is to determine vehicle state information, that is, information such as a position, attitude, speed and front wheel rotation angle of a vehicle is determined in a known coordinate system. The second part is control, including navigation control and execution control, so that the vehicle travels along a certain path or travels following certain rules.

The vehicle state information is determined mainly through the multi-sensor fusion technology. For example, the GNSS real-time kinematic (RTK) Carrier Phase Differential technology is used for acquiring information about a centimeter-level position and a centimeter-level velocity, an Inertial Measurement Unit (IMU) sensor of a Micro-Electro-Mechanical System (MEMS) and GNSS fusion are used for acquiring information about attitude and heading of the vehicle and compensate terrain, and a Hall sensor or a gyroscope sensor is used for acquiring a front wheel rotation angle or a front wheel rotation angle rate of a vehicle in real time.

The control part mainly includes path planning, vehicle modeling, navigation control and steering control. The path planning is to design and define an expected traveling path of the vehicle, and is classified into two manners: a pre-planning manner and an implementation planning manner. The vehicle modeling provides a basis for the design of the navigation control and steering control method, involving vehicle body modelling, steering actuator modelling, etc. The navigation control generates a steering angle or steering rate instruction for controlling vehicle steering according to a current state of the vehicle and a target path, thereby driving the vehicle to travel along the target path. The steering control is mainly to control a steering system of the vehicle to rotate, and is an instruction given by a steering angle tracking navigation controller.

The vehicle involved in the vehicle navigation guidance system provided by the embodiments of the present application includes, but is not limited to, a ground vehicle, an aircraft or a water vehicle. The ground vehicle includes, but is not limited to, an agricultural vehicle (such as a tractor, a harvester and the like) and an engineering machinery vehicle (such as a roller, a crane and the like). The vehicle types include front wheel steering, rear wheel steering, track steering and the like.

FIG. 1 is a structural diagram of a vehicle navigation guidance system according to an embodiment of the present application. As shown in FIG. 1, the system includes a navigation controller 101, a steering angle sensor 102, a motor steering controller 103 and a display controller 104. The steering angle sensor 102 is communicatively connected to the navigation controller 101, and is configured to acquire rotational angular velocity information of a wheel relative to a vehicle body, and output the angular velocity information to the navigation controller. The navigation controller 101 is configured to output navigation guidance information according to positioning information and the angular velocity information, where the navigation controller includes a first positioning device, and the first positioning device is configured to acquire the positioning information. The motor steering controller 103 is communicatively connected to the navigation controller 101, and is configured to perform steering control according to the navigation guidance information. The display controller 104 is communicatively connected to the navigation controller 101, and is configured to display the navigation guidance information.

Exemplarily, the motor steering controller 103 is connected to a vehicle 106 to be controlled to implement the steering control. Optionally, the steering angle sensor 102 may also be connected to the motor steering controller 103 to implement more precise steering control. Optionally, a GNSS receiving antenna 105 may also be externally connected to the navigation controller 101, so as to acquire the positioning information more precisely. Optionally, the first positioning device may be a high precise GNSS positioning module. Optionally, a platform (operating system) in the display controller can be an Android platform, a Windows platform, or other platform.

By adopting the above technical solution, the vehicle navigation guidance system provided by the embodiment of the present application can determine the navigation guidance information more reasonably and automatically control the steering of the vehicle.

Figure 2:
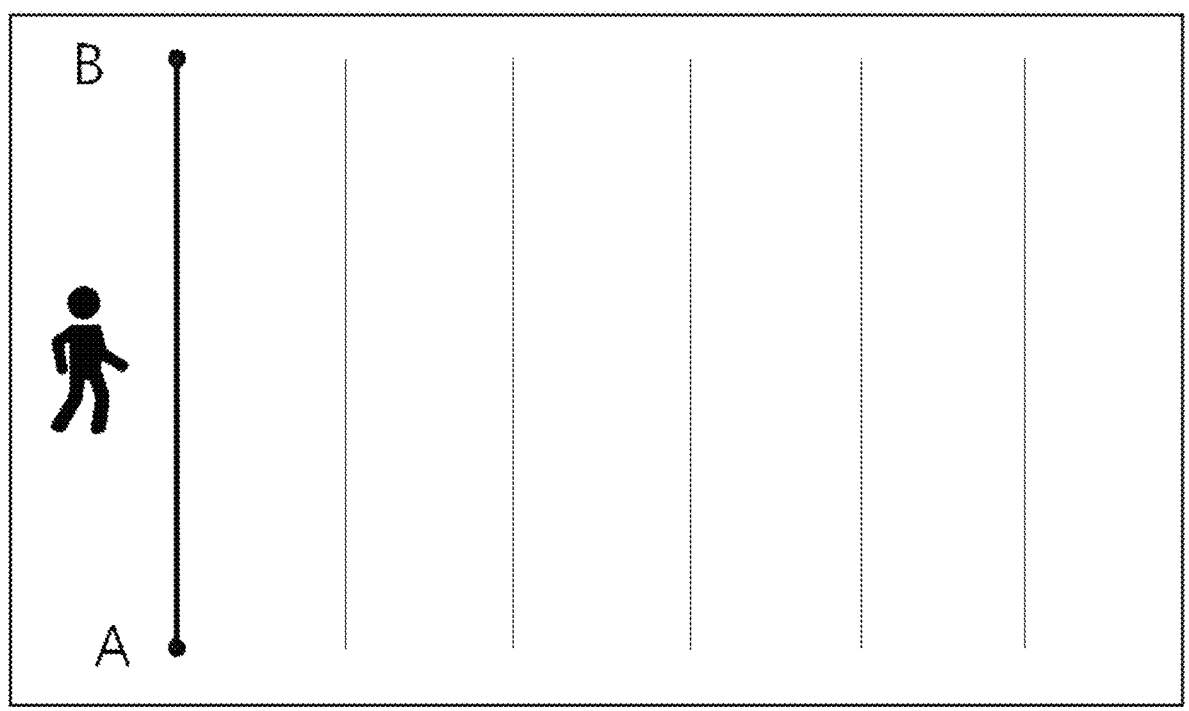
FIG. 2 is a schematic diagram of a navigation line determination manner according to an embodiment of the present application.

In some embodiments, the display controller is detachably installed in the vehicle. The display controller includes a second positioning device, and the display controller is further configured to control the second positioning device to collect position information according to a user operation, and determine a navigation line and/or acquire boundary information of a work area according to the position information. The advantage of such configurations is that the destruction on land can be greatly reduced and the fuel consumption of vehicles can be reduced. Optionally, the second positioning device may be a high precise GNSS positioning module. Optionally, in the process of using, the positioning can be performed by using the high precise GNSS positioning module built in the display controller, and in order to improve positioning accuracy and precision, an external GNSS antenna can be connected. FIG. 2 is a schematic diagram of a navigation line determination manner according to an embodiment of the present application. A user can hold a display controller with hand and set point A (which may be regarded as a first ending point of the navigation line) on a ground end of the work area. In this case, the second positioning device acquires the current position as point A. Then the user can walk or ride a motorcycle around the work area to arrive a design point, and set point B (which may be regarded as a second ending point of the navigation line). In this case, the second positioning device acquires the current position as point B, and then determines the navigation line. Similarly, the work area boundary can be collected by using the display controller in the manner described above.

In some embodiments, the first positioning device is a GNSS positioning module, and the navigation controller is further integrated with a built-in GNSS antenna module, an IMU sensor, a radio receiver, a fourth generation mobile communication technology (4G)/General Packet Radio Service (GPRS) receiver, a programmable logic controller (PLC), and a central processing unit (CPU). Optionally, the radio receiver receives, in real time, differential information sent from a base station radio and sends the information to the GNSS positioning module. The 4G/GPRS receiver receives, in real time, differential information sent by a base station or a server and sends the information to the GNSS positioning module. The PLC controller is configured to process a Pulse Width Modulation (PWM) signal, convert a control amount calculated by the navigation controller into a PWM signal, and send the PWM signal to the motor steering controller and/or a solenoid valve. Optionally, the PLC supports hydraulic steering. The IMU sensor can be designed based on the MEMS device, and is classified into two types: 6-axis and 9-axis. The IMU sensor mainly collects a three-axis angular velocity, three-axis acceleration and magnetic fields in three directions of the vehicle, sends this original IMU data to a high-performance CPU processor, and outputs information such as an attitude, heading and the like of the vehicle after the fusion of the IMU data and GNSS positioning information. The GNSS receiving antenna module may be composed of one, two or more antennas, and supports an L-band signal. In order to solve the problem that the installation condition of Hall sensor is strict and the calibration needs to be performed before the installation, in the present application, it is proposed to replace the Hall sensor with the IMU and implement the tracking of steering angle and angle rate in combination with a vehicle model.

In some embodiments, the first positioning device supports at least one of augmentation modes: real time kinematic (RTK) carrier phase differential, a satellite-based augmentation system (SBAS), a differential global positioning system (DGPS), precise point positioning (PPP) or PPP-RTK. The GNSS positioning module can output information higher than 5 Hz, such as the position, speed, heading and the like. The advantage of such configurations is that by means of the signal augmentation system (satellite-based augmentation system, ground-based augmentation system), guidance and machine control on vehicles at different navigational accuracies from meter level, submeter level to centimeter level can be realized. The GNSS receivers can support satellite-based augmentation and ground-based augmentation, which reduces the requirement for communication links. The feature attribute of the RTK and PPP technology can be used for path planning.

In some embodiments, the CPU determines position information, attitude information, heading information and speed information of the vehicle by acquiring positioning information output by the first positioning device and sensing information output by the IMU, and determines a control amount at a next moment by further combing a preset control algorithm.

In some embodiments, the motor steering controller includes a steering drive motor module, a fixing bracket module, a clamp module, a sleeve module and a steering wheel collar module. The steering drive motor module includes a motor. The fixing bracket module is used for fixing the motor body and the vehicle steering mechanism, is installed at a fixed position on the bottom of the motor and is fastened to a steering rod through the clamp module. The sleeve module is fastened to a rotation shaft inside the motor through a motor flange to implement synchronous movement between the sleeve and the rotation shaft, and a sleeve spline is in shaft-meshing engagement with a spline at an end of a vehicle shaft. The steering wheel collar module is fastened to the rotation shaft through a motor flange to implement synchronous movement between the steering wheel collar and the rotation shaft, and thus to support manual operation for vehicle steering operation. The radius of the steering wheel collar is relatively large, which increases the arm of force, so that the operation of the steering wheel with hands is smoother and lighter.

Figure 3:
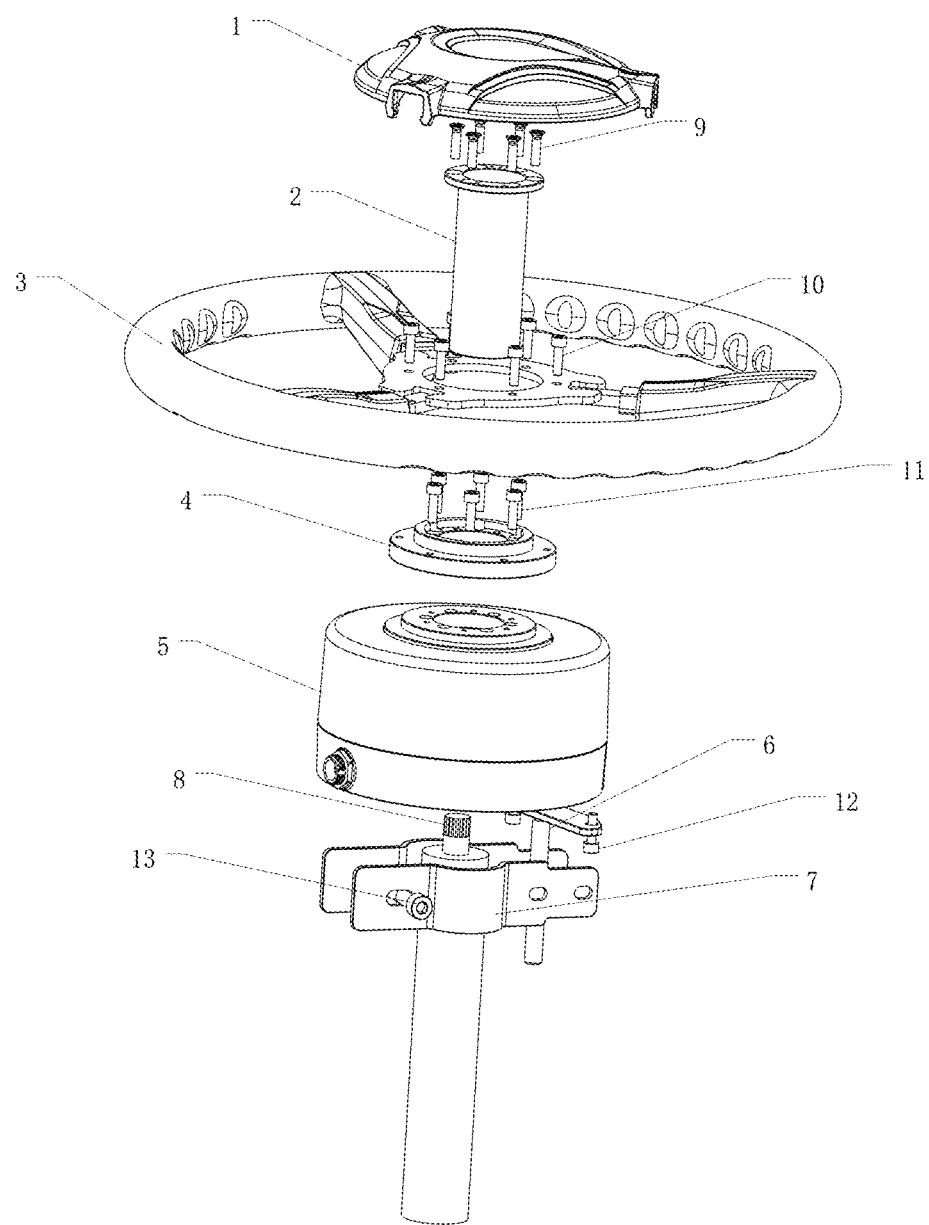
FIG. 3 is an assembly diagram of a motor steering controller according to an embodiment of the present application.

Optionally, FIG. 3 is an assembly diagram of a motor steering controller according to an embodiment of the present application. As shown in FIG. 3, the fixing bracket module is composed of a T-type mounting bracket 6 and a fixing clamp 7. The fixing bracket module is used for fixing the part of the motor body 5 and the vehicle steering mechanism. The T-type mounting bracket 6 is installed at a fixed position on the bottom of the motor through a first matched screw 12, and the T-type mounting bracket 6 is fastened to the steering rod through the fixing clamp 7 and a second matched screw 13. The integrated motor is an internal rotor motor. The non-rotating part of the motor is fixed to the fixed part of the vehicle steering through the fixing bracket module, so that the rotation angle of the motor is the same as the rotation angle of the rotation shaft. The sleeve module 2 is fastened to the rotation shaft inside the motor through a motor flange 4 and a third matched screw 9 to implement synchronous movement with the rotation shaft inside the motor, and a spline of the sleeve module 2 is in shaft-meshing engagement with a spline 8 at an end of a vehicle shaft. A protective cover 1 is provided on the third matched screw 9 to prevent the third matched screw 9 from falling off. The steering wheel collar module 3 is fastened to the rotation shaft inside the motor through the motor flange 4, a fourth matched screw 10 and a fifth matched screw 11 to implement synchronous movement between the steering wheel collar and the rotation shaft, and is configured to support manual operation for vehicle steering operation.

In some embodiments, the steering drive motor module adopts a design scheme of an inner rotor torque motor, and integrates a driver module, a motor, and a magnetic encoder module. The advantage of such configurations is that the installation space can be saved, and at the same time, the risk of external interference introduced by the external driver and encoder can be avoided, improving the reliability of steering mechanism. The design scheme of an inner rotor torque motor may adopt a design scheme of rotor magnet steel and a stator adopting a winding, and it is avoided to use the design scheme of a wave winding disc-type motor, so that the actual output torque of the motor is increased. Meanwhile, the stator winding adopts a design scheme of a chute, so that the actual cogging torque of the motor is smaller, and the blocking phenomenon during the motor is rotated is avoided. The motor winding adopts the epoxy sealing treatment, integrates the winding, the iron core and the insulation material, avoiding the problem that corrosion caused by the fact that the iron core, the winding and the like are exposed to air affects the motor-rotating magnetic field distribution and the output torque fluctuation. The encoder module inside the motor adopts a magnetic incremental encoder module reaching IP65 class, which also meets the application scenario with high temperature of 80° and high humidity. The resolution of the encoder exceeds 10000 ppr. In addition, the encoder read head and the magnetic gate are designed in a contactless manner, the read head is fixed at an end of the motor, the magnetic gate rotates synchronously with the rotation shaft of the motor by fixing to a structural component, thereby improving the stability of the encoder and improving the service life of the encoder. The Hall sensor is integrated in the motor. When the motor is started, the problem that the motor fails to start in a scenario of large resistance or caused by external force is effectively avoided. The driver adopts a custom ring driver structure, and is fixed at the bottom of the motor, to facilitate motor cabling and product maintenance. Meanwhile, the driver can be used under power supply of 9V to 32V. For the steering drive device of the automatic driving system of agricultural and engineering machinery equipment, the common steering drive device is a hydraulic valve steering drive mechanism, a stepping motor control steering drive mechanism or a disc motor steering driving mechanism, or adopts one of the following manners: the motor driving the rotation shaft to rotate through a gear drive mechanism or a belt drive mechanism, etc. The installation of the actual system is complicated and the maintenance is cumbersome. At the same time, due to the existence of the gap of the drive mechanism, the actual steering control accuracy is poor and the control response is slow. In addition, for the agricultural equipment with large horsepower, the versatility of the steering drive device is poor. The present application provides a scheme for driving a steering wheel to rotate by a motor integrating a driver and a motor with a large torque and a large moment of force, which can effectively overcome the defects in the related art.

In some embodiments, the motor includes three Hall sensors. The Hall sensor is used to start the motor. The magnetic encoder is configured to implement internal closed loop control of the motor.

In some embodiments, a winding of the motor adopts a design scheme of a winding chute angle, and waterproofing adopts a frame oil sealing and structural concave-convex waterproof scheme. The surface of the motor is designed with a boss structure, which allows the rain to quickly slip from the surface of the motor when it is raining outdoors, with less rain flowing into the rotation shaft part. At the same time, the rotation shaft part adopts the design scheme of frame oil sealing, effectively preventing water from flowing inside the motor from the rotation shaft part. The installation parts of the motor and the driver adopt the structural waterproofing scheme, the upper cover and the lower cover are designed with a concave-convex structure, and waterproof rubber rings are added to solve the waterproof problem at installation parts of different structural components. The electrical port adopts a design of a rectangular mixed connector, and the power port and the communication port are designed to be mixed, unifying the cabling, simplifying the installation and facilitating the waterproof design. The actual waterproof grade of the conventional motor is low, and in a scene requiring large torque, the reliability of the motor is poor. The waterproof scheme provided by the embodiment of the present application can better solve this problem.

In some embodiment, in an operation state of manually controlling steering, the driver module is configured to disconnect power supply to the motor, and a motor output torque current is 0; and in an automatic driving state, the motor is configured to move by receiving a rotation angle or rotational speed instruction issued by the navigation controller, so as to implement rotation of a mechanism rotation shaft and change of a rotation angle of front wheels.

Figure 4:
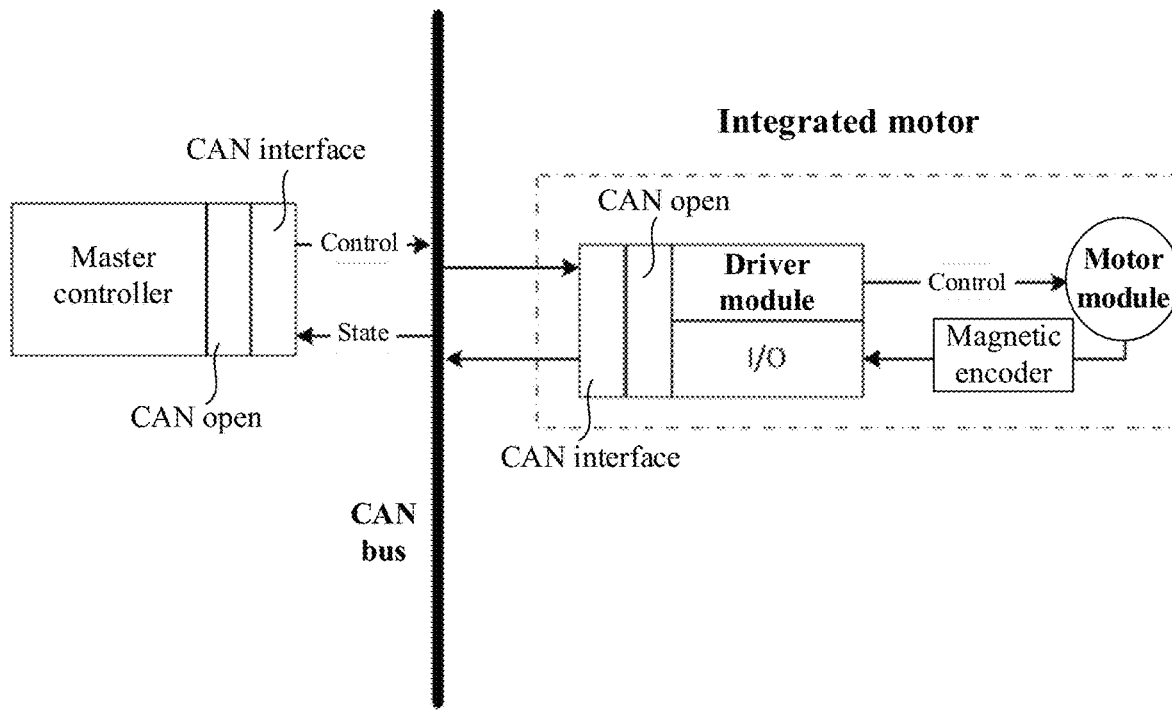
FIG. 4 is a schematic diagram of an control scheme of an integrated motor according to an embodiment of the present application.

Exemplarily, FIG. 4 is a schematic diagram of a control scheme of an integrated motor according to an embodiment of the present application. The relevant content can be understood with reference to FIG. 4. In some embodiments, the motor supports Controller Area Network (CAN) bus control and serial port RS232/RS495 control, and supports a CAN bus motor control CANopen protocol and a custom CAN communication protocol. The motor supports close-loop control of position, speed and torque. Actually, the motor can receive a target position instruction, a target speed instruction and an output torque instruction, which are issued by a master controller (navigation controller), to realize the closed-loop control of the motor, and in practice, a period during which the driver performs the motor control is less than 0.1 ms. The motor integrates a magnetic encoder so that the motor can feed back the information about the actual position and the speed of the motor in real time. The motor supports a hardware protection function, so that hardware of the motor and driver can be protected by setting parameters such as current, overload time, position error window and speed error window of the motor.

When the hardware is abnormal, the driver automatically disconnects the power supply to the motor, and the motor is in a free retardation state. The motor supports a communication node protection function. When the control part of the system is abnormal and the motor does not receive the CAN frame information from the master controller in 500 ms to 1 s, the driver inside the motor will automatically control the motor to stop running, so as to prevent the motor from being stuck in one direction when the host computer is abnormal.

In some embodiments, the system further includes a vehicle control device. The vehicle control device is configured to perform multiple calibration steps, and the multiple calibration steps include at least one of the following: all-attitude installation calibration, wheel angle sensor calibration, electronic steering wheel automatic calibration, or system electronic equipment and sensor installation error automatic calibration, where the wheel angle sensor calibration is performed based on vehicle motion, and the electronic steering wheel automatic calibration is performed based on an automatically-generated steering command. When there are the above four steps of calibration, at the time of the initial calibration, the execution of steps must be carried out in the order of all-attitude installation calibration, wheel angle sensor calibration, electronic steering wheel automatic calibration and system electronic equipment and sensor installation error automatic calibration. Since the subsequent calibration steps depend on the previous calibration results, any one of the four steps can be re-calibrated independently after the completion of the initial calibration.

The calibration steps described above will be described below.

Figure 5:
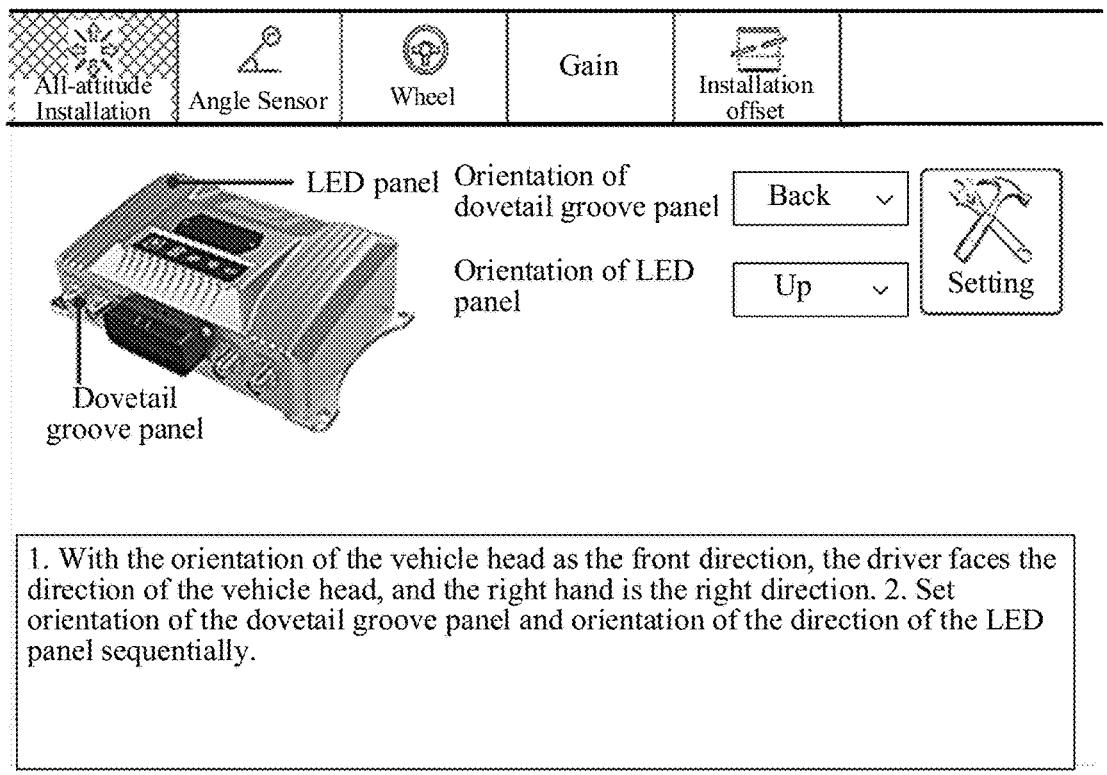
FIG. 5 is a schematic diagram of an interface of an all-attitude installation calibration according to an embodiment of the present application.

FIG. 5 is a schematic diagram of an interface of an all-attitude installation calibration according to an embodiment of the present application. The present application designs an interface of the all-attitude installation, that is, an IMU sensor coordinate axis conversion interface. In this figure, the orientation corresponding to physical equipment is defined in detail. In this way, the installation direction of the IMU sensor or a carrier of the IMU sensor can be quickly set to be consistent with a desired direction. The all-attitude installation method supports 26 kinds of methods for installing the IMU sensor or the carrier of the IMU sensor, which can greatly reduce the requirements of installation space and installation position of the equipment. With a direction that the driver faces right ahead in the cab as a reference, the front, back, left, right, up and down these six directions are divided, and the controller carrying the IMU sensor needs to be installed as far as possible according to the right direction (orientation of a dovetail groove and an LED lamp panel) without any tilting; the orientation of the dovetail groove and the orientation of the LED lamp panel are sequentially selected, and the key of setting is clicked. The state of the setting is displayed at the lower part of the current interface.

FIG. 6 is a schematic diagram of an interface of a wheel angle sensor calibration according to an embodiment of the present application. The present application is a non-mechanical sensor based on an inertial sensor. The advantage of this sensor is that it is easy to install and is hardly to be damaged, the correspondence between the original value of its analog quantity and the actual rotation angle does not need to be calibrated, and it is very suitable for complicated application scenes of agricultural machinery operation. The interface method can provide the selection of the manners for installing an angle sensor on a left wheel or a right wheel, improving adaptability of the system and correcting the asymmetric error during the calculation. At the same time, this interface method provides the threshold setting, which can satisfy the sensitivity to noise of different application scenes. When the installation position of the angle sensor is set, the installation position on the left front wheel is selected as LEFT, the installation position on the right front wheel is set to RIGHT. The type of the sensor is automatically identified by the system. There are two thresholds below. If the vehicle performs vibration verification, these two thresholds are increased, thereby satisfying the system demands, and normally, these thresholds are by default.

FIG. 7 is a schematic diagram of an interface of an electronic steering wheel automatic calibration according to an embodiment of the present application. The left side of the figure is a calibration result display area, and the right side is the setting content of parameters related to electronic steering wheel control. This interface method can automatically and quickly fit a dynamic characteristic curve of the electronic steering wheel when certain calibration conditions are satisfied, thus providing the guarantee for accurate control. First, the motor is ensured to be capable of being normally enabled and disabled, and the motor can normally lock the shaft and loose the shaft. The rotating speed of an engine is controlled to be more than 1000 rpm, and the vehicle is kept moving forwards at the speed of 2 to 3 km/h. Then key START is clicked, and the key START is changed into CALIBRATING. In this case, the calibration process is in progress. The vehicle is still kept moving forwards, the steering wheel will slowly rotate left and right at the moment, and meanwhile, the wheels will rotate left and right by about 10°. This process is automatic, and manual intervention is not needed. After the calibration is finished, a dialog box can pop up on the interface to indicate that the calibration is successful or failed. If the calibration is failed, specific failure causes will be prompted, and the user can perform recalibration after removing the fault.

FIG. 8 is a schematic diagram of an interface of a system electronic equipment and sensor installation error automatic calibration according to an embodiment of the present application. This method can calibrate an installation error angle of the all-attitude angle and an installation error of the front wheel angle in one step. This method is quick and convenient, has stable and credible calibration results, and can quickly and accurately calculate an installation error angle of duel antennas, an installation error angle of the IMU sensor or the carrier carrying the IMU sensor, and an installation error angle of the front wheel angle sensor. The motion information of the vehicle body can be accurately reflected after the system data goes through the calibration data modification in the above step. Exemplarily, a tractor is used as an example of the vehicle. The following steps are performed: searching for an open and flat road surface at least 70 m long, clicking ENTERING CALIBRATION GUIDE, clicking START CALIBRATION, and clicking A; manually driving the tractor to move forward for about 70 m, where the following content is displayed at the upper part of the interface: the distance to point A, the speed of less than 3 km/h, the moving track is a straight line; then stopping the tractor, clicking B, and clicking NEXT STEP; turning the tractor around; and trying hard to drive the tractor onto the line AB until the tractor reaches point B, clicking NEXT STEP when NEXT STEP on the interface is operable, and at the same time, moving hands away from the steering wheel, thereby the tractor automatically drives to point A, and clicking NEXT STEP when NEXT STEP on the interface becomes operable, where in this process, the speed of the tractor should be kept about 2 km/h in the process. Moreover, the following steps are performed: turning the tractor around; trying hard to drive the tractor onto line AB before the tractor reaches point A; clicking NEXT STEP when NEXT STEP on the interface becomes operable, thereby the tractor automatically drives to point B; and when NEXT STEP on the interface becomes operable, clicking NEXT STEP until the end, where in this process, the speed of the tractor is kept at about 2 km/h. The results of the calibration, success or failure, can be observed in the state bar.

Figure 9:
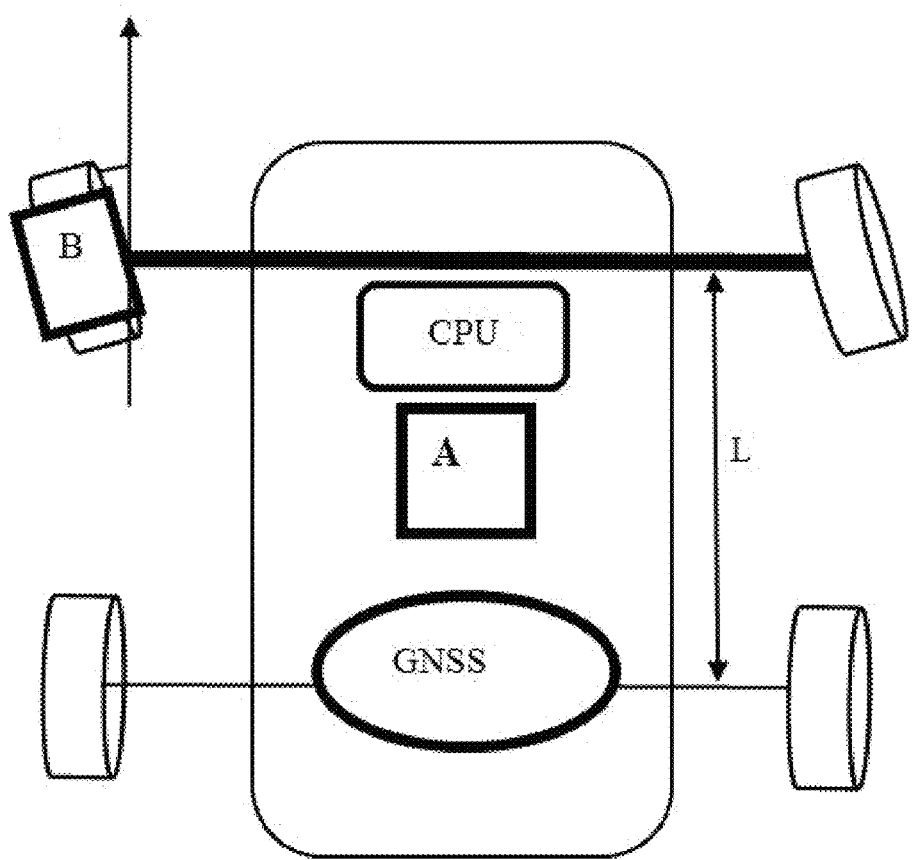
FIG. 9 is a schematic diagram of an installation manner for a steering angle sensor according to an embodiment of the present application.

In some embodiments, the steering angle sensor includes a main single-axis gyroscope and a sub-single-axis gyroscope. The main single-axis gyroscope is installed in a centroid position of the vehicle, and is configured to measure a rotational angular velocity of the vehicle body. The sub-single-axis gyroscope is installed on a front wheel of the vehicle, and is configured to measure a rotational angular velocity of the front wheel. FIG. 9 is a schematic diagram of an installation manner for a steering angle sensor according to an embodiment of the present application. For main single-axis gyroscope A, the main single-axis gyroscope is installed on the vehicle body horizontally with sensitive shaft vertical, and the main single-axis gyroscope measures a rotational angular velocity of the vehicle body and calculates a rotational angular velocity of the wheel relative to the vehicle body according to the above angular velocity and an angular velocity measured by a single-axis gyroscope installed on a kingpin of the wheel, where A may be a single-axis gyroscope or a IMU Z-axis gyroscope output. For sub-single-axis gyroscope B, the sub-single-axis gyroscope is installed on the kingpin of the wheel of the vehicle, and the sub-single-axis gyroscope measures magnitude of a rotational angular velocity of the wheel and calculates a rotational angular velocity of the wheel relative to the vehicle body according to the above angular velocity and the angular velocity measured by the single-axis gyroscope installed on the vehicle body, where B normally is a single-axis gyroscope. For GNSS receiver, the GNSS receiver acquires a running speed of the vehicle in real time, and can calculate an angle of a wheel relative to the vehicle body according to the vehicle speed and vehicle model information. The precision of the angle is poor and cannot meet the precision requirement of intelligent driving and control. However, the angle precision is uniform and can be fused with an angle of gyroscopic integrator to estimate and modifying the system error of the gyroscope, thereby realizing high-precision, high dynamic rotational angle tracking. For CUP processor, the CUP processor mainly realizes the acquisition and synchronization of angular velocity of each main and sub-single axis gyroscope and the GNSS velocity, and the running of vehicle front wheel rotation tracking algorithm. The embodiment of the present application adopts a design scheme of contactless single-axis gyroscope and GNSS receiver to track the rotation angle and rotational angular velocity of the wheel, instead of the conventional contact mechanical angle sensor scheme, avoiding bracket customization, calibration and periodic inspection and maintenance, and the above equipment is easy to install and maintain, greatly reducing after costs. By adopting the design scheme of main-single-axis gyroscope and sub-single-axis gyroscope, the rotational angular velocity of the vehicle body and the rotational angular velocity of the wheel are measured respectively through single-axis gyroscopes (the three-axis gyroscope is the same as the IMU in essence) installed on the vehicle body and the wheel kingpin, thus calculating the rotational angular velocity of the wheel relative to the vehicle body, and the rotation angle of the wheel relative to the vehicle body is calculated by integrating the relative angular velocity, that is, the dynamic tracking of the wheel rotation angle is realized through the single-axis gyroscope.

Figure 10:
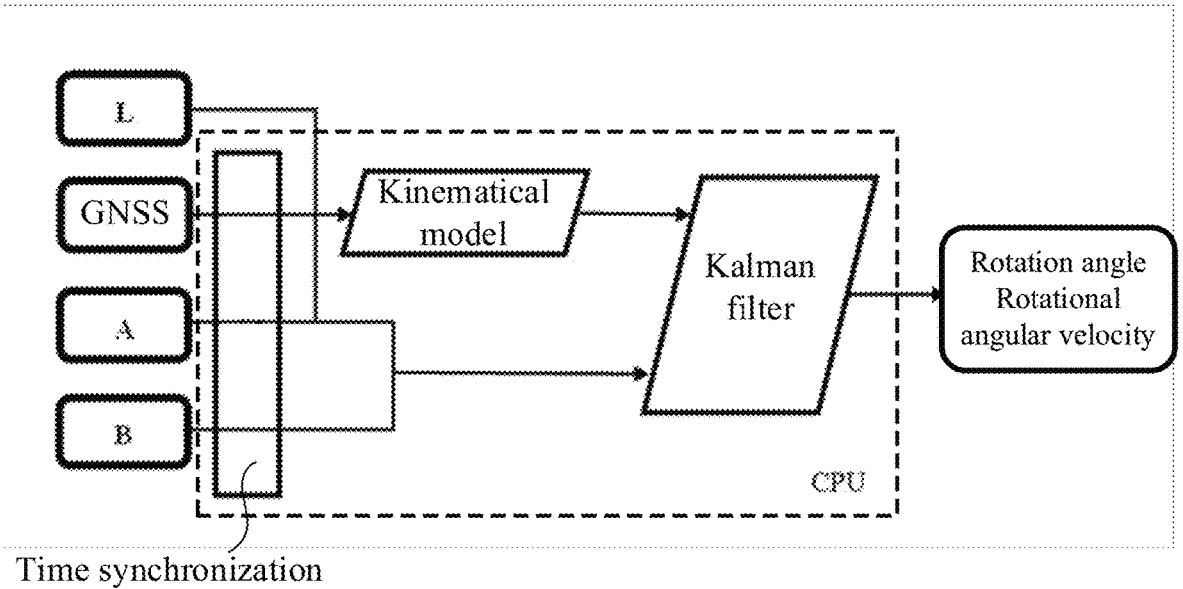
FIG. 10 is a schematic diagram of a principle of a vehicle wheel rotation angle tracking algorithm according to an embodiment of the present application.

FIG. 10 is a schematic diagram of a principle of a vehicle wheel rotation angle tracking algorithm according to an embodiment of the present application. The principle of the vehicle wheel rotation tracking algorithm in the present application will be described below with reference to FIGS. 9 and 10.

In first step, after a GNSS receiver is initialized, speed information and a PPS second pulse signal of the GNSS receiver are transmitted into a CPU processor.

In second step, after gyroscopes A and B are initialized, since gyroscope output contains zero offset terms, an average value of a segment of angular velocity output in a static state is taken as an initial zero offset of the gyroscopes, and zero offset compensation is performed on angular velocity output of the gyroscopes.

In third step, according to the PPS second pulse signal of the GNSS receiver and a clock of the CPU, time synchronization is performed on the GNSS speed information and angular velocity information of gyroscopes A and B.

In fourth step, a rotational angular velocity of a wheel relative to a vehicle body is calculated according to the angular velocity of the gyroscope output of A and B.

In fifth step, a Kalman filter model is constructed based on an angle tracking algorithm, and time update and measurement update of the filter are performed.

In sixth step, whether the GNSS speed information is updated is determined; if the GNSS speed information is not updated, the measurement update of the Kalman filter is performed by using the rotational angular velocity of the wheel relative to the vehicle body calculated according to the angular velocity of the gyroscope output of A and B; if the GNSS speed is updated, a wheel rotation angle W is calculated according to the following vehicle kinematical model, and the measurement update of the Kalman filter is performed by using W.

$$W = a \tan(\varphi_A V_{gnss}/L)$$

In the above vehicle kinematical model, W denotes a front wheel rotation angle, $\varphi_A$ denotes angular velocity of the vehicle body, $V_{gnss}$ denotes a running speed of the vehicle acquired by the GNSS receiver, and L denotes a distance from the shaft center of the front wheel to the shaft center of the rear wheel.

In seventh step, whether the vehicle is in a stationary state is determined according to the speed information of the GNSS, and if the vehicle is in the stationary state, the zero offsets of gyroscopes A and B are adaptively updated.

The embodiment of the present application uses the GNSS receiver to measure the vehicle speed, and calculates the rotation angle of the wheel relative to the vehicle body by combining with the vehicle model, the wheel rotation angle calculated through the gyroscope is fused with the above vehicle speed and rotation angle of the wheel relative to the vehicle body, so that high dynamic and high precision of the gyroscope and the uniform precision of the speed model are complemented by each other's advantages.

Figure 11:
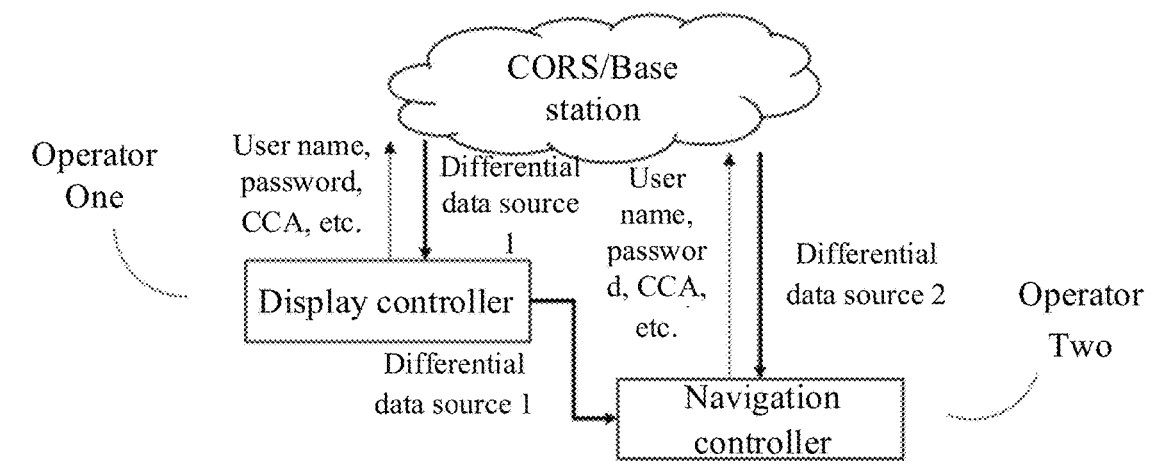
FIG. 11 is a schematic diagram of acquisition of real-time differential data by dual 4G/GPRS online communication according to an embodiment of the present application.

In some embodiments, the navigation controller and the display controller each are provided with a 4G/GPRS receiver, and the navigation controller determines a target network signal according to a 4G/GPRS network signal of a first operator acquired by the navigation controller and a 4G/GPRS network signal of a second operator acquired by the display controller based on signal strength and/or differential age, and provides the target network signal to the first positioning device. FIG. 11 is a schematic diagram of acquisition of real-time differential data by dual 4G/GPRS online communication according to an embodiment of the present application. Operator One is the second operator, and Operator Two is the first operator. As shown in FIG. 11, the display controller and the navigation controller respectively operate actions of logging in a base station or a server simultaneously, where the display controller uses a 4G/GPRS network of Operator One, and the navigation controller uses a 4G/GPRS network of Operator Two, and the navigation controller simultaneously acquires two paths of differential signals, and sends an optimal differential signal to the GNSS module according to signal strength or differential age, so that the probability of signal break of system equipment can be greatly reduced, and the uninterrupted operation requirement of a user for 24 hours can be met.

In some embodiments, at least one automatic turn-around path determination manner is provided for a user to select. Different turn-around path automatic determination manners can be applied to different scenes. Here are examples.

In a first manner, coordinate points of a path are determined by using three circles with an equal radius, where a first circle and a second circle are in an externally-tangent relationship, the second circle and a third circle are in an externally-tangent relationship, the first circle passes through a starting point of a turn-around path, the third circle passes through an ending point of the turn-around path, a radius of curvature of the coordinate points is greater than a minimum turning radius of steering of the vehicle, and a rotational speed control amount of a front wheel corresponding to the coordinate points is less than a maximum rotational speed of an actuator.

Figure 12:
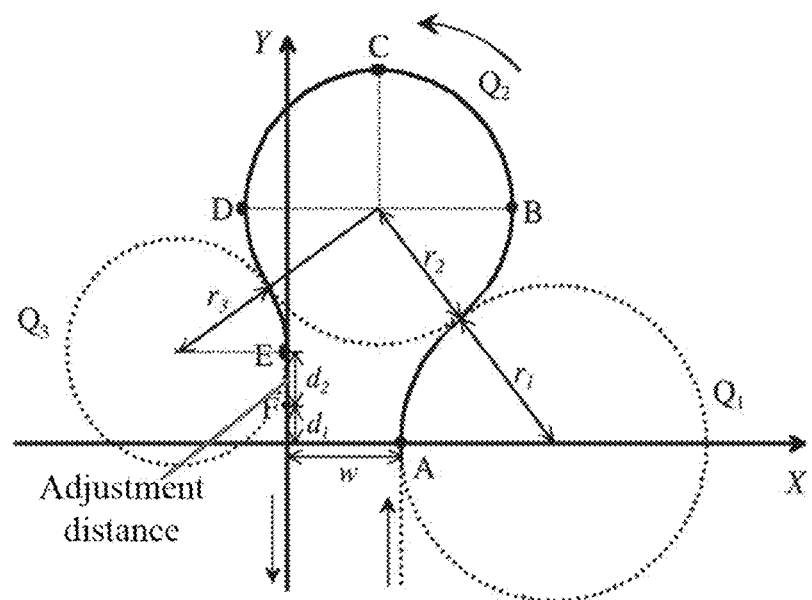
FIG. 12 is a flowchart of an automatic turn-around method according to an embodiment of the present application.

FIG. 12 is a flowchart of an automatic turn-around method according to an embodiment of the present application. The three circles in the figure generate a path satisfying constraints through changes of the constraints, and this manner is applicable to the scene where a vehicle cannot back in the process of automatic turn-around. In the figure, A is a starting point of the turn-around path, B, C and D are sample points on the turn-around path, E is an ending point of the turn-around path, w is a width (the width between the two navigation lines), where a distance d2 on EF is a path transited from a circular curve to a straight line, a distance d1 is a straight line entry distance, and length of the two paths is related to the actual speed of the vehicle, and is not in the range of the turn-around path. In the calculation of the center coordinates, the prerequisite is that the coordinate of point A, the direction (Y-axis positive direction) of the straight line across point A, the width w and the minimum turning radius Rmin of steering of the vehicle are known. In the figure, the coordinates of the origin point are denoted as (0, 0), and the coordinates of center of Q1 are denoted as (r1+w, 0); Q2y is equal to $((r1+r2)^2-(r1+w/2)^2)^{0.5}$, and the coordinates of center of Q2 are denoted as (w/2, Q2y); and Q3y is equal to $((r2+r3)^2-(r3+w/2)^2)^{0.5}$, and the coordinates of center of Q3 are denoted as (−r3, Q2y−Q3y).

Optionally, the steps are described below.

(1) The radius of each of three circles is set to the minimum turning radius of the vehicle steering, i.e. r1=r2=r3=Rmin, where Rmin is the minimum turning radius of the vehicle steering.

(2) Coordinate points of the path are generated according to the externally-tangent relationship between the three circles in FIG. 5.

(3) A radius of curvature of the coordinate points of the path in step (2) is calculated, whether the radius of curvature satisfies the constraint is determined, that is, whether the radius of curvature is greater than the minimum turning radius of the vehicle, and if the radius of curvature does not satisfy the constraints, the radius of each of the circles is increased by 10 cm, and then the coordinate points of the path are calculated.

(4) Step (3) is repeated until the turning radius of the coordinate points of the path satisfies the constraint, that is, the turning radius is greater than the minimum turning radius.

(5) A rotational speed control amount Ud of the front wheel required for the coordinate points of the path is calculated, and whether the rotational speed control amount Ud is less than the maximum actuator rotational speed Umax is determined, and if this constraint is not satisfied, the radius of each of the circles to which B, C and D belong is increased by 10 cm.

(6) Step (5) is repeated until the constraints are satisfied.

Since the distance between d1 and d2 shown in the figure is a path adjustment distance, its value is related to the width w and vehicle constraints Rmin and Umax.

In a second manner, coordinate points of a path are determined by using two segments of circular arcs with a center angle of 90° satisfying a mirror relationship and a connection line of corresponding ending points of the two segments of circular arcs, where one segment of circular arc passes through a starting point of a turn-around path, the other segment of circular arc passes through an ending point of the turn-around path, the connection line is a path for backing the vehicle, a radius of curvature of the coordinate points is greater than a minimum turning radius of steering of the vehicle, and a front wheel speed control amount corresponding to the coordinate points is less than a maximum actuator rotational speed.

Figure 13:
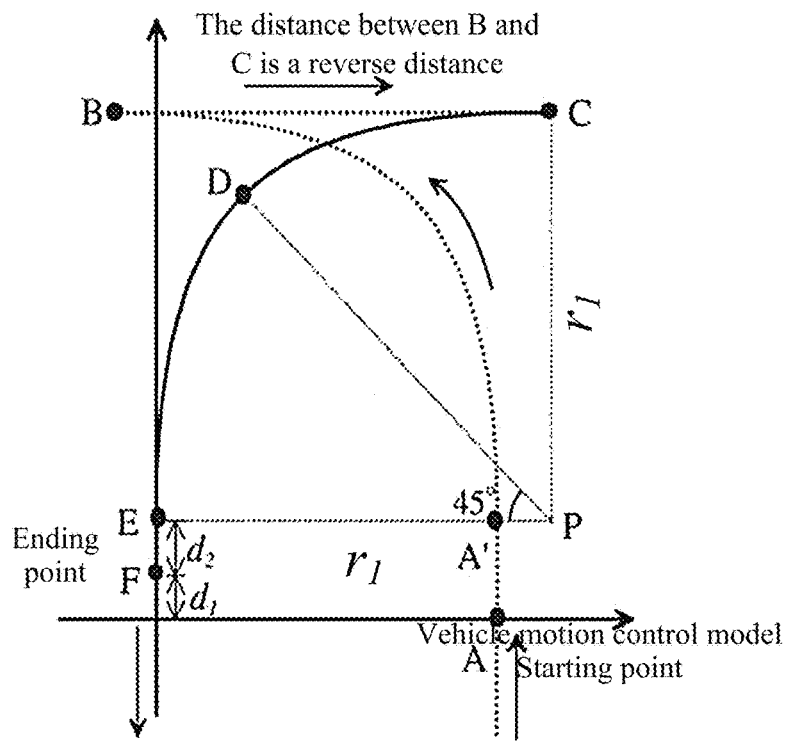
FIG. 13 is a flowchart of another automatic turn-around method according to an embodiment of the present application.

FIG. 13 is a flowchart of another automatic turn-around method according to an embodiment of the present application. In this method, the turn-around path is short, point A' is a starting point of the turn-around path, E is an ending point of the turn-around path, and B, C and D are sample points on the turn-around path. The center angle of 90° corresponding to each of the two segments of circular arcs is 90°. The coordinates of point E are denoted as (0, 0), coordinates of a center of circular arc EC are denoted as (r1, 0), and coordinates of a center of circular arc A'B are denoted as (r1−w, 0). B→C is the backing direction. In this method, in order to ensure that the turn-around entry line coincides with the target path, that is, the tangent direction of the circular arc is the same as the direction of the target navigation line EF, the path planning is firstly generated by CE path planning coordinate points, and then the path A'B is generated through a symmetrical relation.

Optionally, the steps are described below.

(1) The radius of the circle is set to the minimum turning radius of the vehicle steering, i.e. r1=Rmin, where Rmin is the minimum turning radius of the vehicle steering.

(2) Coordinates of the circular arc CE are generated by using the radius Rmin and coordinates of point E.

(3) A radius of curvature of the coordinate points of the path in step (2) is calculated, whether the radius of curvature satisfies the constraints is determined, that is, the radius of curvature is greater than the minimum turning radius of the vehicle, and if the radius of curvature does not satisfy the constraints, the radius of the circle is increased by 10 cm, and then the coordinate points of the path are calculated.

(4) Step (3) is repeated until the turning radius of the coordinate points of the path satisfies the constraint, that is, the turning radius is greater than the minimum turning radius.

(5) A rotational speed control amount Ud of the front wheel required for the coordinate points of the path is calculated, and whether the rotational speed control amount Ud is less than the maximum actuator rotational speed Umax is determined, and if the rotational speed control amount Ud is not less than the maximum actuator rotational speed Umax, the radius of the circle is increased by 10 cm.

(6) Step (5) is repeated until the constraints are satisfied.

(7) After the path satisfies each convergence condition, the path is reversed as a path between A' and B, where AA' is a preparation distance for turning around and entering the navigation line, and EF is a distance for entering the navigation line after turning around and leaving the line.

In a third manner, coordinate points of a path are determined by using two circles with an equal radius satisfying a externally-tangent relationship, where one circle passes through a starting point of a turn-around path, a externally-tangent line of the other circle passes through an ending point of the turn-around path, a tangent point of the two circles is a starting point of a path for backing the vehicle, the starting point of the turn-around path is on a first navigation line, the starting point of the path for backing the vehicle is on a second navigation line, the first navigation line is adjacent to the second navigation line, a radius of curvature of the coordinate points is greater than a minimum turning radius of steering of the vehicle, and a rotational speed control amount of a front wheel corresponding to the coordinate points is less than a maximum rotational speed of an actuator.

Figure 14:
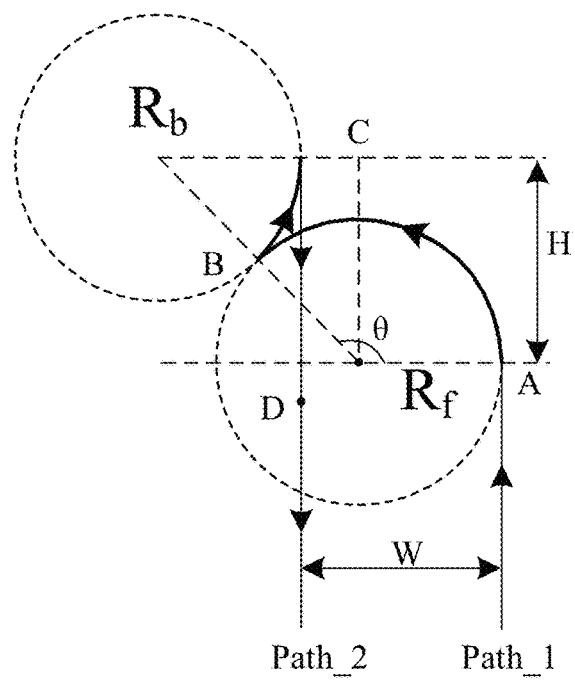
FIG. 14 is a flowchart of yet another automatic turn-around method according to an embodiment of the present application.

FIG. 14 is a flowchart of yet another automatic turn-around method according to an embodiment of the present application. In this method, the turn-around path is short, AB is for moving forward, BC is for backing the vehicle, and CD is for moving forward. In the figure, A is a starting point of the turn-around path, B and C are sample points on the turn-around path, D is an ending point of the turn-around path, coordinates of point D are denoted as (0, 0), DA is denoted as the X-axis direction, DC is denoted as the Y-axis direction, coordinates of a center of circular arc AB are denoted as (w−Rf, 0), H is equal to $((Rb+Rf)^2-(w-Rf+Rb)^2)^{0.5}$, and coordinates of a center of circular arc BC are denoted as (−Rb, H).

Optionally, the steps are described below.

(1) The radius of each circle is set to the minimum turning radius of the vehicle steering, i.e. Rf=Rb=Rmin, where Rmin is the minimum turning radius of the vehicle steering.

(2) According to the externally-tangent relationship between two circles in the figure, circle Rf circle passes through point A, point Rb passes through point C, Rb and Rf all pass through point B, point A is on Path 1, point C is on Path 2, Path 1 and Path 2 are two adjacent target navigation lines, the distance between which is w, and when the above constrains are satisfied, coordinate points of the path are generated.

(3) A radius of curvature of the coordinate points of the path in step (2) is calculated, whether the radius of curvature satisfies the constraints is determined, that is, the radius of curvature is greater than the minimum turning radius of the vehicle, and if the radius of curvature does not satisfy the constraints, the radius of the circle is increased by 10 cm, and then the coordinate points of the path are calculated.

(4) Step (3) is repeated until the turning radius of the coordinate points of the path satisfies the constraint, that is, the turning radius is greater than the minimum turning radius.

(5) A rotational speed control amount Ud of the front wheel required for the coordinate points of the path is calculated, and whether the rotational speed control amount Ud is less than the maximum actuator rotational speed Umax is determined, and if the rotational speed control amount Ud is not less than the maximum actuator rotational speed Umax, the radius of the circle is increased by 10 cm.

(6) Step (5) is repeated until the constraints are satisfied.

In a closed place or other application scenes, for example, for the operation of a rice transplanter, the closeness of its operation environment provides an application scene for realizing the automatic turn-around function. The foregoing three automatic turn-around path track generation and implementation manners provided in the embodiment of the present application provide a solution to the unmanned driving in agricultural operation.

The embodiments of the present application can solve the problems of cumbersome navigation installation and calibration, high cost, lack of low-cost path planning, and with a positioning accuracy which may be greatly affected by distance from the base station and the like of the agricultural machinery in related art. Optionally, for the agricultural machinery with a steering wheel, the control amount is that the steering of the agricultural machinery is used as its actuator, and its actuating performance of the actuator is greatly different due to different vehicles, different temperatures, different vehicle ages and the like. In addition, if the calibration error of the system equipment, including such as the controller, the IMU and the GNSS antenna is relatively large, the automatic driving effect will not be ideal, and even worse, the phenomenon of out-of-control occurs, so that the automatic driving cannot be realized. By adopting the vehicle navigation guidance system provided by the embodiments of the present application, the above technical problems can be well solved based on satellite-based and ground-based augmentation systems and meanwhile with integration of the electric control steering wheel with a large torque and a large moment of force.

The embodiments of the present application further provide a vehicle. The vehicle includes, but is not limited to, a ground vehicle, an aircraft or a water vehicle. The ground vehicle includes, but is not limited to, an agricultural vehicle (such as a tractor, a harvester and the like) and an engineering machinery vehicle (such as a roller, a crane and the like). The vehicle types include front wheel steering, rear wheel steering, track steering and the like. The vehicle is installed with the vehicle navigation guidance system provided in any embodiment of the present application.

By adopting the above technical solution, the vehicle provided by the embodiments of the present application can determine the navigation guidance information more reasonably and automatically control the steering of the vehicle.

What is claimed is:

1. A vehicle navigation guidance system, installed in a vehicle, comprising: a navigation controller, a steering angle sensor, a motor steering controller and a display controller; wherein
the steering angle sensor is communicatively connected to the navigation controller, and is configured to acquire rotational angular velocity information of a wheel relative to a vehicle body, and output the angular velocity information to the navigation controller;
the navigation controller is configured to output navigation guidance information according to positioning information and the angular velocity information, wherein the navigation controller comprises a first positioning device, and the first positioning device is configured to acquire the positioning information;
the motor steering controller is communicatively connected to the navigation controller, and is configured to perform steering control according to the navigation guidance information;
the display controller is communicatively connected to the navigation controller, and is configured to display the navigation guidance information;
wherein the display controller is detachably installed in the vehicle, the display controller comprises a second positioning device, and the display controller is further configured to control, according to a user operation, the second positioning device to collect position information, and determine, according to the position information, at least one of a navigation line or a work area boundary.

2. The system of claim 1, wherein the first positioning device is a Global Navigation Satellite System (GNSS) positioning module, and the navigation controller is further integrated with a GNSS antenna module, an inertial measurement unit (IMU) sensor, a radio receiver, a 4G/General Packet Radio Service (GPRS) receiver, a programmable logic controller (PLC), and a central processing unit (CPU).

3. The system of claim 2, wherein the first positioning device is configured to support at least one of augmentation modes: real time kinematic (RTK) carrier phase differential, a satellite-based augmentation system (SBAS), a differential global positioning system (DGPS), precise point positioning (PPP) or PPP-RTK.

4. The system of claim 2, wherein the CPU is configured to determine position information, attitude information, heading information and speed information of the vehicle by acquiring the positioning information output by the first positioning device and sensing information output by the IMU sensor, and determine a control amount at a next moment by further combining a preset control algorithm, wherein the control amount is included in the navigation guidance information.

5. The system of claim 1, wherein the motor steering controller comprises a steering drive motor module, a fixing bracket module, a clamp module, a sleeve module and a steering wheel collar module, and the steering drive motor module comprises a motor; wherein
the fixing bracket module is installed at a bottom of the motor and is fastened to a steering rod of the vehicle through the clamp module;
the sleeve module is fastened to a rotation shaft inside the motor through a motor flange to implement synchronous movement with the rotation shaft, and a sleeve spline is in shaft-meshing engagement with a spline at an end of a vehicle rotation shaft;
the steering wheel collar module is fastened to the rotation shaft through the motor flange to implement synchronous movement with the rotation shaft.

6. The system of claim 1, wherein the steering drive motor module is configured to integrate a driver module, a motor and a magnetic encoder module by adopting a design scheme of an inner rotor torque motor.

7. The system of claim 6, wherein the motor comprises three Hall sensors, the Hall sensors are configured to start the motor, and the magnetic encoder is configured to implement internal closed loop control of the motor.

8. The system of claim 6, wherein the motor is provided with a winding which adopts a design scheme of a winding chute angle, and waterproofing of the motor adopts a frame oil sealing and structural concave-convex waterproof scheme.

9. The system of claim 6, wherein in an operation state of manually controlling steering, the driver module is configured to disconnect power supply to the motor, and a motor output torque current is 0; and in an automatic driving state, the motor is configured to move by receiving a rotation angle or rotational speed instruction issued by the navigation controller, so as to implement rotation of the rotation shaft of the motor and change of a rotation angle of front wheels of the motor, wherein the rotation angle or rotational speed instruction is included in the navigation guidance information.

10. The system of claim 1, further comprising a vehicle control device, wherein the vehicle control device is configured to perform a plurality of calibration steps, and the plurality of calibration steps comprises at least one of the following:

an all-attitude installation calibration, a wheel angle sensor calibration, an electronic steering wheel automatic calibration, or a system electronic equipment and sensor installation error automatic calibration, wherein the wheel angle sensor calibration is performed based on vehicle motion, and the electronic steering wheel automatic calibration is performed based on an automatically-generated steering command.

11. The system of claim 1, wherein the vehicle comprises at least one of: a ground vehicle, an aircraft or a water vehicle, and wherein the ground vehicle comprises at least one of an agricultural vehicle or an engineering machinery vehicle.

12. The system of claim 1, wherein the steering angle sensor comprises a main single-axis gyroscope and a sub-single-axis gyroscope; wherein the main single-axis gyroscope is installed in a centroid position of the vehicle, and is configured to measure a first rotational angular velocity of the vehicle body; and the sub-single-axis gyroscope is installed on a front wheel of the vehicle, and is configured to measure a second rotational angular velocity of the front wheel;

wherein the first rotational angular velocity and the second rotational angular velocity are used for calculating a rotational angular velocity of the wheel relative to the vehicle body.

13. The system of claim 1, wherein each of the navigation controller and the display controller is provided with a 4G/GPRS receiver, and the navigation controller is configured to determine a target network signal according to a 4G/GPRS network signal of a first operator acquired by the navigation controller and a 4G/GPRS network signal of a second operator acquired by the display controller, and provide the target network signal to the first positioning device and based on at least one of signal strength or age of differential.

14. The system of claim 1, wherein the system is configured to provide an automatic turn-around path determination manner for a user to select, wherein the determination manner comprises at least one of the following manners:

determining coordinate points of a path by using three circles with an equal radius, wherein a first circle and a second circle are in an externally-tangent relationship, the second circle and a third circle are in an externally-tangent relationship, the first circle passes through a starting point of a turn-around path, the third circle passes through an ending point of the turn-around path, a radius of curvature of the coordinate points is greater than a minimum turning radius of steering of the vehicle, and a rotational speed control amount of a front wheel corresponding to the coordinate points is less than a maximum rotational speed of an actuator;

determining coordinate points of a path by using two segments of circular arcs, which are both with a center angle of 90° and satisfy a mirror relationship, and using a connection line of corresponding ending points of the two segments of circular arcs, wherein one segment of circular arc passes through a starting point of a turn-around path, the other segment of circular arc passes through an ending point of the turn-around path, the connection line is a path for backing the vehicle, a radius of curvature of the coordinate points is greater than a minimum turning radius of steering of the vehicle, and a speed control amount of a front wheel corresponding to the coordinate points is less than a maximum rotational speed of an actuator; or determining coordinate points of a path by using two circles which have an equal radius and satisfy an externally-tangent relationship, wherein one circle passes through a starting point of a turn-around path, an externally-tangent line of the other circle passes through an ending point of the turn-around path, a tangent point of the two circles is a starting point of a path for backing the vehicle, the starting point of the turn-around path is on a first navigation line, the starting point of the path for backing the vehicle is on a second navigation line, the first navigation line is adjacent to the second navigation line, a radius of curvature of the coordinate points is greater than a minimum turning radius of steering of the vehicle, and a rotational speed control amount of a front wheel corresponding to the coordinate points is less than a maximum rotational speed of an actuator.

15. A vehicle, comprising a vehicle navigation guidance system installed in the vehicle; wherein the vehicle navigation guidance system comprises: a navigation controller, a steering angle sensor, a motor steering controller and a display controller; and wherein the steering angle sensor is communicatively connected to the navigation controller, and is configured to acquire rotational angular velocity information of a wheel relative to a vehicle body, and output the angular velocity information to the navigation controller;

the navigation controller is configured to output navigation guidance information according to positioning information and the angular velocity information, wherein the navigation controller comprises a first positioning device, and the first positioning device is configured to acquire the positioning information;

the motor steering controller is communicatively connected to the navigation controller, and is configured to perform steering control according to the navigation guidance information;

the display controller is communicatively connected to the navigation controller, and is configured to display the navigation guidance information;

wherein the display controller is detachably installed in the vehicle, the display controller comprises a second positioning device, and the display controller is further configured to control, according to a user operation, the second positioning device to collect position information, and determine, according to the position information, at least one of a navigation line or a work area boundary.

16. The vehicle of claim 15, wherein the first positioning device is a Global Navigation Satellite System (GNSS) positioning module, and the navigation controller is further integrated with a GNSS antenna module, an inertial measurement unit (IMU) sensor, a radio receiver, a 4G/General Packet Radio Service (GPRS) receiver, a programmable logic controller (PLC), and a central processing unit (CPU).

17. The vehicle of claim 16, wherein the first positioning device is configured to support at least one of augmentation modes: real time kinematic (RTK) carrier phase differential, a satellite-based augmentation system (SBAS), a differential global positioning system (DGPS), precise point positioning (PPP) or PPP-RTK.

18. The vehicle of claim 16, wherein the CPU is configured to determine position information, attitude information, heading information and speed information of the vehicle by acquiring the positioning information output by the first positioning device and sensing information output by the IMU sensor, and determine a control amount at a next moment by further combining a preset control algorithm, wherein the control amount is included in the navigation guidance information.

* * * * *